United States Patent [19]

Hoppe

[11] E Re. 29,500

[45] Reissued Dec. 20, 1977

[54] SCANNING CHARGED BEAM PARTICLE BEAM MICROSCOPE

[75] Inventor: Walter Hoppe, Munich, Germany

[73] Assignee: Max-Planck-Gesellschaft zur Förderung der Wissenschaften e.V., Germany

[21] Appl. No.: 710,420

[22] Filed: Aug. 2, 1976

Related U.S. Patent Documents

Reissue of:

[64] Patent No.: 3,857,034
Issued: Dec. 24, 1974
Appl. No.: 358,080
Filed: May 7, 1973

U.S. Applications:

[63] Continuation of Ser. No. 161,137, July 9, 1971, abandoned.

[30] Foreign Application Priority Data

Aug. 31, 1970 Germany ..... 2043749

[51] Int. Cl.[2] ..... H01J 37/26; G01N 23/00

[52] U.S. Cl. ..... 250/311; 250/310; 250/396 ML; 250/398

[58] Field of Search ..... 250/305, 306, 307, 309, 250/310, 311, 396, 398

[56] References Cited

U.S. PATENT DOCUMENTS

| | | | |
|---|---|---|---|
| 2,464,419 | 3/1949 | Smith et al. | 250/307 |
| 3,569,698 | 3/1971 | Herrman | 250/398 |
| 3,626,184 | 12/1971 | Crewe | 250/305 |
| 3,644,733 | 2/1972 | Wolf et al. | 250/396 |

FOREIGN PATENT DOCUMENTS

| | | | |
|---|---|---|---|
| 1,489,111 | 10/1969 | Germany | 250/311 |

*Primary Examiner*—Alfred E. Smith
*Assistant Examiner*—T. N. Grigsby
*Attorney, Agent, or Firm*—Herbert L. Lerner

[57] ABSTRACT

For dark-field imaging of the specimen, a scanning corpuscular-beam microscope is equipped with multiple annular apertures located between the beam source and the specimen on the one hand and between the specimen and the detector on the other hand. The areas of the multiple annular apertures conjointly i.e. complementarily cover the ray path. The aperture situated in front of the detector is surrounded by a wide, radiation-transmitting region. The invention affords utilizing for the generation of the image not only the rays scattered outside of the aperture cone but also a large part of the rays scattered within this cone.

9 Claims, 7 Drawing Figures

SCANNING CHARGED BEAM PARTICLE BEAM MICROSCOPE

Matter enclosed in heavy brackets [ ] appears in the original patent but forms no part of this reissue specification; matter printed in italics indicates the additions made by reissue.

This is a continuation, of application Serial No. 161,137, filed July 9, 1971, now abandoned.

My invention relates to a scanning corpuscular-beam microscope with a beam generator, a deflection system for the beam, a condenser lens for focussing the beam on a specimen to be imaged, an aperture arrangement for dark-field imaging the specimen, as well as a detector arrangement in which portions of the beam are recorded that are scattered as the specimen is illuminated. The invention is important particularly for scanning electron microscopes but can be applied to scanning corpuscular-beam microscopes of other kinds, such as ion microscopes.

In an electron microscope of the type predominantly used, which will be called "conventional" in the following, the electron beam emanating from the cathode is directed by a condenser onto a relatively large area of the specimen, all elements of the specimen structure in this area being imaged simultaneously in the image plane by an electron-optical system. In a scanning microscope, however, the specimen is scanned by an extremely small spot; the signals emanating from the elements of the specimen structure are received sequentially in time by a detector which in turn varies the beam intensity of an image-reproducing tube controlled synchronously with the deflection system of the microscope in the manner of a television tube. It is known to use dark-field imaging in a scanning electron microscope of this type. This is described, for instance, in a paper by von Ardenne in Zeitschrift fuer Physik, 1938, p. 553 to 572, particularly p. 557, FIG. 4. Here is used, for the taking of transmission pictures, an annular detector which is arranged underneath the specimen and which lets the central, direct beam pass through, such a detector having the same effect as a central, disk-shaped aperture.

For attaining high resolution in a scanning electron microscope, the lens which produces the scanning spot must, for physical reasons, have a correspondingly large aperture. If one now uses, with a large illuminating aperture, dark-field imaging after von Ardenne with a central, disk-shaped aperture, very many scattered electrons are not sensed by the detector because they are in the cone of the primary beam and are therefore intercepted by the aperture. With low resolution this effect does not occur, as the corresponding aperture of the illuminating beam cone is so small that only a negligibly small part of the scattered rays are contained in the primary beam and is thereby lost for the imaging process.

It is an object of my invention to increase, in a high-resolution scanning corpuscular-beam microscope of the kind mentioned above, the number of corpuscles that can be recorded by the detector, and to increase thereby the output signal of the detector.

According to my invention there is arranged between the source of the beam and the specimen a first aperture with several open (radiation-transmitting) areas or fields, and between the specimen and the detector arrangement a second aperture with a first, central region and a second region surrounding the former, the first region being complementary to the first aperture in such a manner that its closed (radiation-impervious) areas intercept the unscattered radiation passed by the open areas of the first aperture, while the second region consists of an open (radiation-transmitting) field, the area of which is large as compared to the areas of the individual open fields of the first region. Preferably, the open field of the second region has a radial width at least about equal to one-half the radius of the first region.

In principle, the shape and arrangement of the fields of the first aperture, and therefore of the complementary fields of the first region of the second aperture, may be given any desired form. As a rule, however, one will design these fields as concentric rings. The terms "ring" and "concentric" should be understood here in their broader meaning, so that the rings may also deviate from the circular shape. It is of particular advantage to design the first aperture as a phase-correcting zone plate which lets only those partial rays reach the specimen that, after passing through the condenser lens, have phases of the same polarity. The function of such phase-correcting zone plates is described, for instance, in German Pat. No. 1 222 603.

The use of complementary multiple limiting apertures for dark-field imaging in conventional electron microscopes is known from a paper by Riecke in Zeitschrift fuer Naturforschung, 1964, 19a, p. 1,228 to 1,230. Riecke indicated already that the apertures can be designed as phase-correcting zone plates. My invention, however, differs from Riecke's arrangement as to basic design and operation. In the conventional electron microscope the resolution is determined by the aperture of the imaging lens. This aperture cannot be increased arbitrarily because electron lenses have large lens errors. The system of limiting apertures associated with the image has therefore at most the aperture that corresponds to the resolution. In the scanning microscope, however, the aperture cone of the illuminating radiation determines the resolution. Hence, the limiting aperture system associated with the image is not subject to aperture limitation.

This will be explained presently with reference to the accompanying drawings in which FIG. 1a shows an aperture system according to Riecke (prior art), and FIG. 1b an aperture system according to my invention;

Figure 1A:
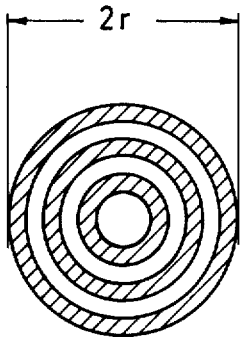

Reverting to the above-mentioned diaphragm system of complementary apertures according to Riecke, such a system is illustrated in FIG. 1a. The complementary limiting aperture system is associated with the imaging lens in a conventional electron microscope. Its maximum diameter must not exceed 2r, the maximum permissible lens aperture set by lens errors.

Figure 1B:
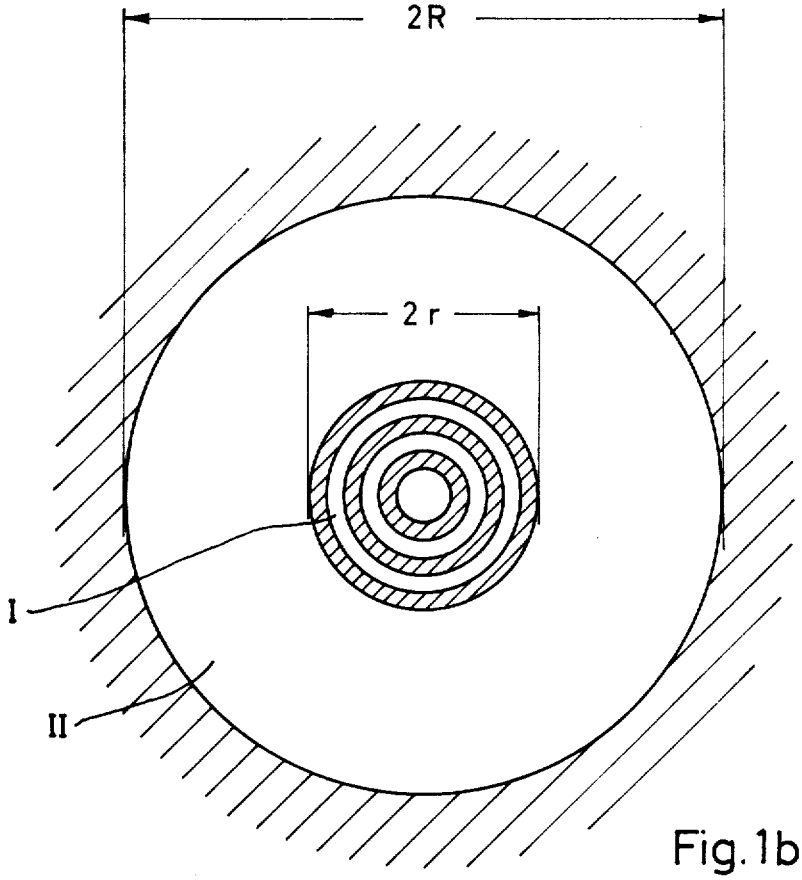

FIG. 1b shows the aperture with the detector in a scanning microscope. It is provided with two aperture regions. The first aperture region (I) is an aperture of a complementary aperture system similar to that in FIG. 1a. The second aperture region (II) consists of an open field of radial width (R–r), which is preferably at least as large as r/2. The overall aperture has therefore the substantially larger diameter 2R (as compared to FIG. 1a), which is no longer constrained by the resolution conditions of a lens. The aperture system according to the invention (FIG. 1b), therefore, can collect many more scattered electrons than an aperture according to FIG. 1a. The advantage in scanning microscopy of my invention over von Ardenne's arrangement will, incidentally, also be seen from FIG. 1b. In that arrangement the aperture would be a full circle within the circle of diameter 2r; the electrons which could be recorded in the open rings would be shielded off. Due to the decline of the atomic factors the number of these electrons is much larger than could be expected from a comparison of the open aperture areas. These considerations are valid also if phase-correcting complementary zone plates are used. In that case, 2r is limited by the residual lens errors of the objective lens corrected by the zone plates; even if these plates are used, 2r cannot be increased arbitrarily.

Thus, my invention affords utilizing for the formation of the image not only the electrons scattered outside the aperture cone but also a large part of the electrons scattered within this cone. Therefore, a sudden jump in detector signal increase can be achieved through the combination of the complementary multiple apertures, known per se in conventional microscopes, and the detector ring aperture in a scanning microscope. If the first aperture is designed as a phase-correcting zone plate, my invention makes it additionally possible to advance even with conventional condenser lenses, having aperture error constants between 1 and 4 mm, to resolutions of about 1, A, i.e., to the atomic range.

As mentioned, a phase-correcting zone plate, in principle, is so designed that only partial beams with phases of the same polarity arrive at a reference point in the image plane. To shield off the partial rays with phases of the opposite polarity, the closed fields of the zone plate must accordingly have a certain minimum width. If within the scope of the invention such a phase-correcting zone plate is used as the first aperture, it is advantageous to choose the width of the closed fields of that aperture larger than the above-mentioned minimum width. Although this leads to a loss in intensity of the spot, it is compensated for by the fact that the open fields of the second aperture, which is in front of the detector and is made complementary, are correspondingly larger, so that the detector signal also becomes relatively larger. The gain is caused by the fact that the radiation loading of the specimen is reduced for an equal detector signal. If this is not important, the intensity of the corpuscular-beam source can also be increased and an absolute increase of the detector signal can be obtained.

In a conventional corpuscular-beam microscope with complementary, phase-correcting multiple annular apertures according to Riecke, an analogous step, i.e., an increase of the open fields of the aperture preceding the objective lens, is not possible, as the correction of the lens error would thereby be impaired.

In scanning the specimen, the aperture cone on the image side also changes its position relative to the second aperture. Especially if the two apertures are matched precisely to each other, it can therefore happen that parts of the direct ray which had been passed by the first aperture also pass through the second aperture. This can be avoided by arranging between the specimen and the second aperture a further deflection system which compensates for the deflection by the first deflection system.

The deflection system on the illumination side consists advantageously of two partial systems following each other in the direction of the beam, the first of which deflects the beam away from the optical axis of the microscope while the second one redirects the deflected beam in such a manner that the axis of the redirected beam intersects the optical axis at least about in the plane of the first aperture. As a result, the illuminating beam always has the same position in the plane of the first aperture relative to the latter. The same condition can be fulfilled, for the position mentioned of the deflection system, also for the second aperture by arranging the first and second apertures in coordinated optical planes of the condenser lens, so that the first region of the second aperture constitutes a physical negative image of the first aperture.

However, with the above-mentioned coordination of the deflection system on the illuminating side relative to the first aperture, the latter aperture can also be placed in the focal plane of the condenser lens. This has the advantage that the same direction of irradiation is obtained regardless of the distance of the axis from the point on the specimen in question.

Underneath the second aperture there can be arranged a uniform detector which integrates all of the corpuscles passing through the open areas of this aperture. One can, however, also provide individual detectors beneath the open areas of the second aperture so that the image of the specimen can be recorded selectively with electrons of different scattering angles. The open fields of the second aperture can advantageously also be designed directly as the entrance areas of concentric, annular radiation detectors, for instance, semiconductor detectors.

For further analyzing the properties of the specimen, there can in addition be arranged behind the second aperture a velocity analyzer which makes it possible to separate elastically and inelastically scattered corpuscles, as is known, for instance, from the German Provisional Pat. No. 1 439 828.

Figure 2:
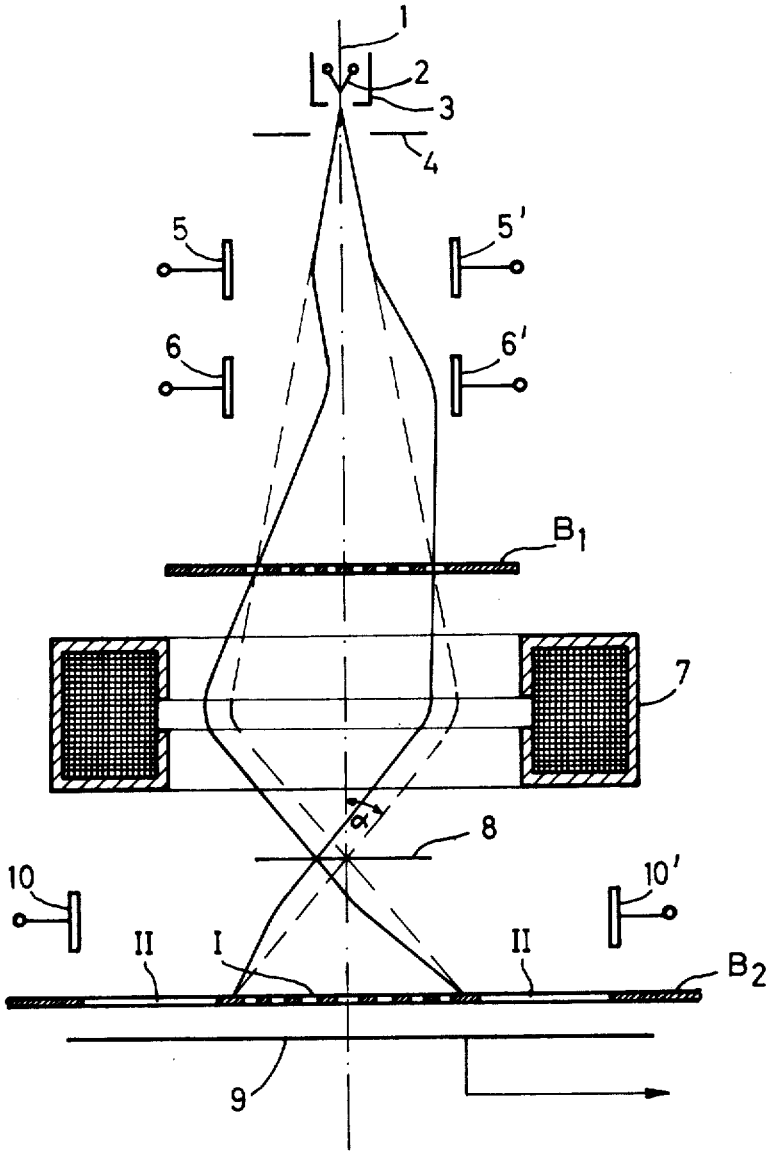
FIGS. 2 and 3 are schematic diagrams of microscopes embodying the invention by way of example.

Referring now to FIG. 2 of the accompanying drawings, the axis of the illustrated scanning electron microscope is denoted by 1. The beam generator may consist of a conventional source which in this example includes a point cathode 2, a Wehnelt cylinder 3 and an anode 4. For instance, the design described in the German Pat. No. 1 031 447 can be used for the beam generator; but a field emission cathode is also applicable.

Following the beam generator, seen in the direction of the beam, is disposed a deflection system which in this example comprises two pairs of electrostatic deflection plates, 5,5' and 6,6'. Two further pairs of plates are provided for deflection in the plane perpendicular to the plane of the drawing. In lieu of an electrostatic deflection system, an electromagnetic deflection system can also be used.

Disposed in the ray path as a condenser lens 7, is a magnetic pole piece lens which images the crossover of the electron beam in front of the cathode as nearly as possible as a point on the specimen 8. The specimen 8 can be arranged on a specimen stage in known manner. A detector 9 receives image signals affected by the specimen 8. The detector passes these signals to a television tube for production of the image.

According to the invention, two apertures $B_1$ and $B_2$ are arranged in the path of the beam. The aperture $B_2$ comprises, according to FIG. 1b, two regions I and II. Both apertures have several annular, concentrically disposed, open (beam-transmitting) areas. The apertures $B_1$ and $B_2$ are complementary to one another inasmuch as one open area of the aperture $B_1$ is always associated with a closed area of the first region of the aperture $B_2$, so that parts of the illuminating beam which are passed by the aperture $B_1$ and penetrate the specimen 8 without being scattered, are intercepted by the closed areas of the aperture $B_2$. Therefore only those electrons arrive at the detector 9 that are scattered elastically or inelastically in the specimen 8. As shown, a large part of those electrons contributes here to the formation of the image which are scattered by the specimen 8 within the primary beam cone with the aperture angle 2a. It is further essential to the invention that the electrons scattered outside the primary beam cone, which traverse the wide, open area of the aperture region II, also contribute to the generation of the signal in the detector 9.

In the ray path according to FIG. 2 the electron beam is first deflected away from the axis by the partial deflection system 5,5' and redirected into the axis by the partial deflection system 6,6' in such a manner that the undeflected and the deflected beam intersect in the plane of the aperture $B_1$. The electron beam therefore has a constant position relative to the aperture $B_1$, regardless of its deflection. Furthermore, the aperture $B_1$ is situated in the focal plane of the condenser lens 7. As a result, each partial beam retains its direction of incidence at the specimen 8 during deflection, as may also be seen from the illustration.

FIG. 2 further shows that in scanning the specimen 8 with the scanning spot, the primary beam cone on the image side also is shifted relative to the aperture $B_2$.

Especially if the apertures $B_1$ and $B_2$ are dimensionally made exactly complementary to each other, it may happen that the aperture $B_2$ passes not only scattered but also unscattered radiation. This can be prevented by making the closed areas of the region I of the aperture $B_2$ somewhat wider than corresponds to the open areas of the aperture $B_1$, but this is achieved at the expense of a loss in scattered radiation. However, one can advantageously provide between the specimen 8 and the aperture $B_2$ a further deflection system 10, 10', which is operated synchronously with the deflection system 5,5', 6,6' on the illuminating side and which compensates for the deflection caused by this deflection system in such a manner that the position of the beam in the plane of the aperture $B_2$ is not changed during scanning of the specimen.

In principle, the diameters and widths of the open and closed areas, respectively, of the apertures $B_1$ and $B_2$ (region I) can be chosen at will. The widths of the areas can, for instance, be equal. It is only necessary that the region I of the aperture $B_2$ be a negative image, enlarged or reduced as the case may be, of the aperture $B_1$ in such a manner that the two apertures together are impervious to the direct beam.

In a preferred embodiment of the invention the aperture $B_1$ is designed as a phase-correcting zone plate which lets only such partial rays get to the specimen that, after passing through the condenser lens, have at least approximately equal phase. In that case the dimensions of the open and closed areas of the aperture $B_1$, and correspondingly of region I of the aperture $B_2$, are governed by the aperture error of the condenser lens 7. The aperture $B_1$ can also be designed so that it corrects for a possibly existing astigmatism error of the condenser lens 7; the areas of the aperture $B_1$ in that case are no longer circular. However, to correct astigmatism of the condenser lens 7, a stigmator can be inserted into the ray path.

Figure 3:
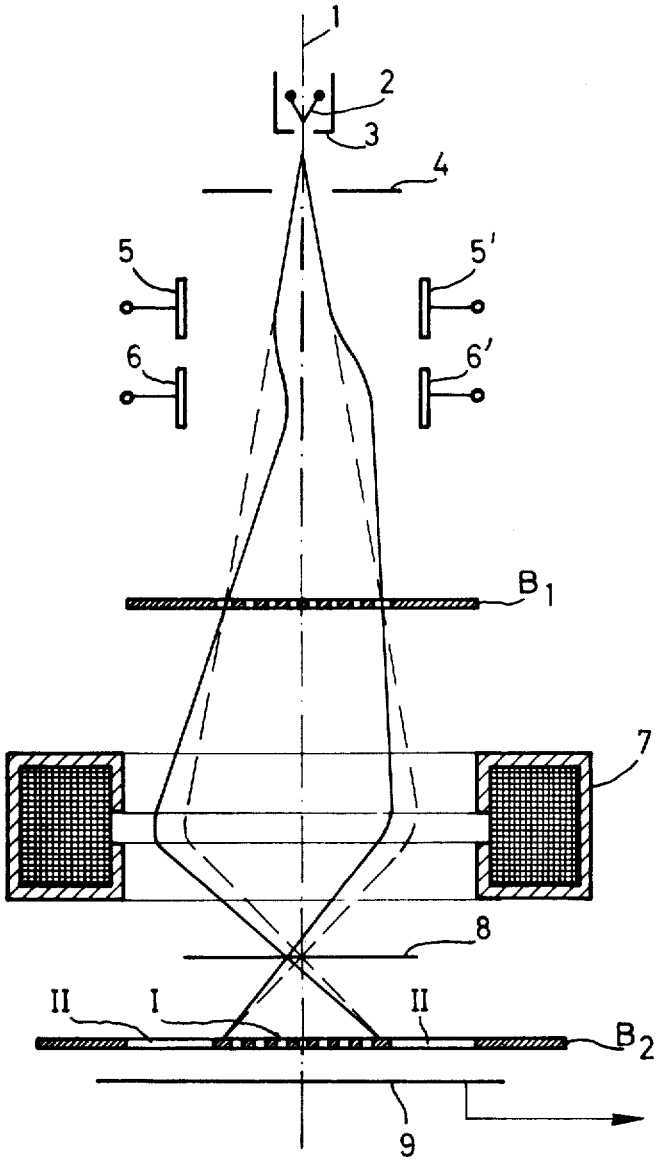

The embodiment according to FIG. 3, in which the same reference symbols ae used as in FIG. 2, is distinguished by the feature that the apertures $B_1$ and $B_2$ are disposed in coordinated optical planes of the condenser lens 7, so that the region I of the aperture $B_2$ constitutes the negative of an image which the condenser lens 7 projects of the aperture $B_1$. Here the deflection system 5,5', 6,6' is also laid out so that the deflected and undeflected partial beams intersect in the plane of the aperture $B_1$. Hence, these partial beams are combined again in correlated points of the aperture $B_2$. In consequence, the primary beam cone on the image side does not change its position in the plane of the aperture $B_2$ as the beam is deflected; and no additional steps are required to assure the complementary action of the two apertures during deflection. This, however, is done at the expense of the fact that the direction of incidence of the beam on the specimen 8 is not quite constant.

In the embodiment according to FIG. 3 the apertures $B_1$ and $B_2$ are spaced from the condenser lens by twice the focal length, they are therefore equal. However, as to the position of the apertures $B_1$ and $B_2$, any other pair of object and image planes with respect to the condenser lens 7 can be selected.

Figure 4:
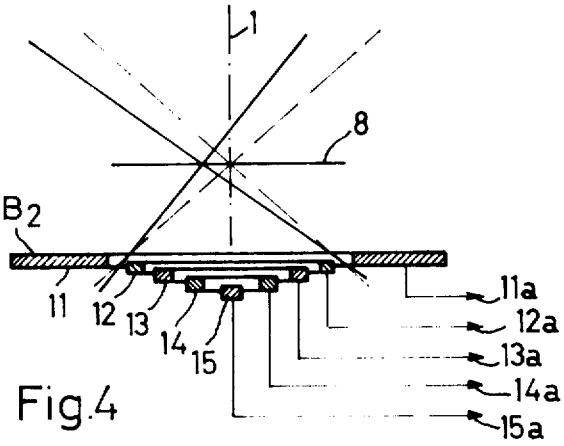
FIG. 4 is a sectional view of another embodiment of an aperture system in a microscope according to the invention.

In FIG. 4 the lower part of the ray path according to FIG. 3 is shown with another design of the aperture $B_2$. The open areas of the aperture $B_2$ are replaced by ring-shaped detectors 11 to 14; and a further central detector 15 is provided on the axis of the arrangement. The clearances between the detectors 11 to 15 correspond to the closed areas of the aperture $B_2$ in FIG. 3; the electrons arriving here are not evaluated. The detectors 12 to 15 together constitute the region I, and the wide detector 11 constitutes the region II of the aperture $B_2$.

The detectors 11 to 15 are individually provided with outputs 11a to 15a, which can be sequentially connected to a picture reproducing tube, or simultaneously to different picture reproducing tubes. The arrangement according to FIG. 4 thus permits selectively utilizing only such electrons for the generation of the picture which are scattered at a given angle by the specimen S.

The detectors 11 to 15 can be designed, for instance, as semiconductor radiation detectors. These are semiconductor bodies with a p–n junction which is biased in the reverse direction and exhibit a pulse-like increase of the cutoff current upon the arrival of an electron. Detectors of this type have the advantage of great sensitivity so as to afford counting single electrons and to use them for the generation of the picture.

Figure 5:
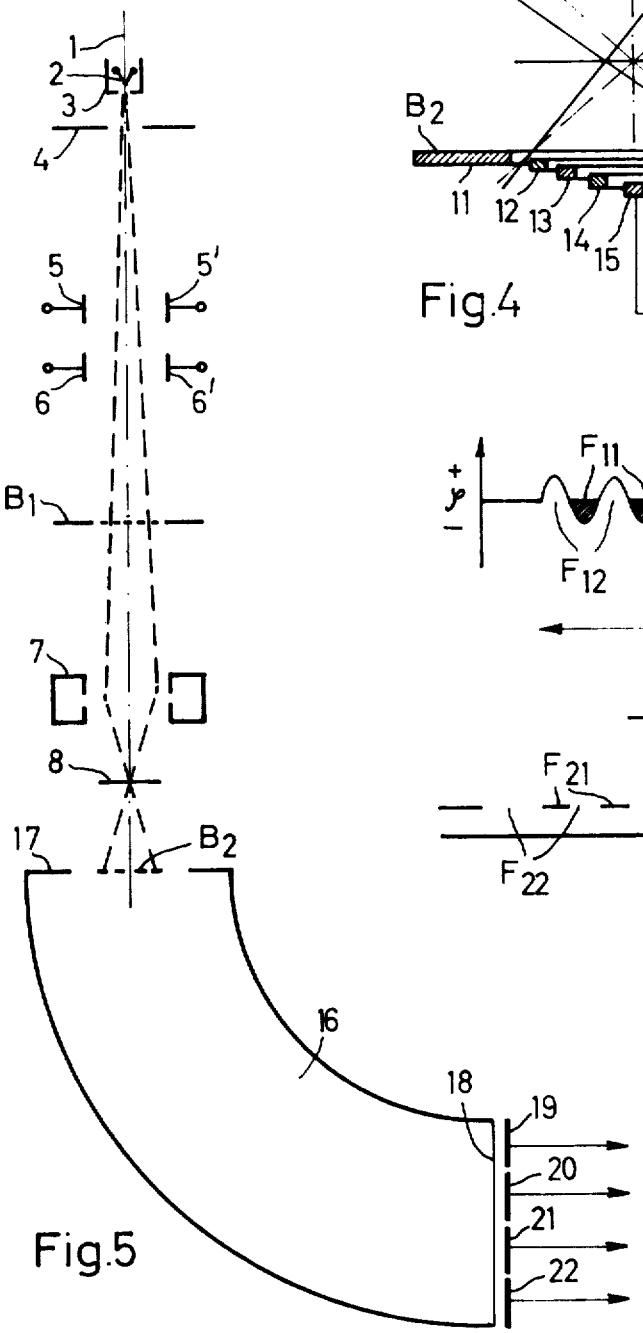
FIG. 5 shows the ray and scanning system of still another embodiment.

To improve the quality of the image or to gain information regarding the material composition of the specimen, it may be desirable to separate in the scattered beam electrons of different energy, particularly elastically and inelastically scattered electrons. An arrangement suited for this purpose is shown in FIG. 5. Here the scanning electron microscope is supplemented by a conventional electrostatic or magnetic velocity analyzer 16 which focusses electrons entering at its front surface 17 at different points of the rear wall 18, depending on their energy. The aperture $B_2$ is situated in the front wall 17. Several detectors 19 to 22 are arranged at the rear wall 18. The detector outputs can be selectively connected to a picture reproducing tube. In this manner it is possible to generate images of the specimen 8 to which only electrons of given energy have contributed.

Figure 6:
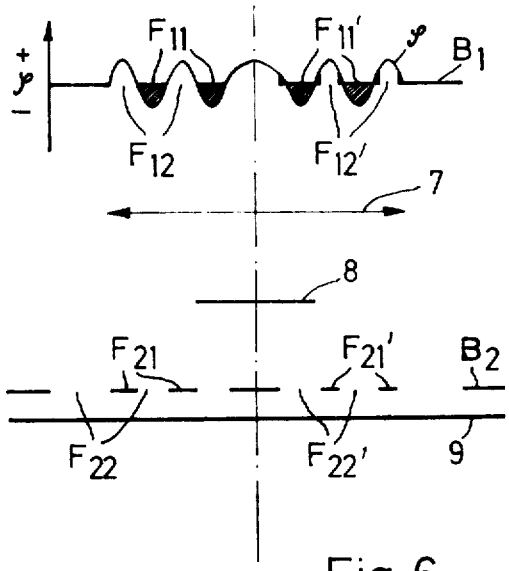
FIG. 6 is an explanatory diagram.

On the left and right-hand side, respectively, of FIG. 6 there are shown two embodiments of the invention in which the first aperture is designed as a phase-correcting zone plate. The illustration shows schematically a part of the scanning microscope, for instance, in the arrangement according to FIG. 2 with the aperture $B_2$, the lens 7, the specimen 8, the aperture $B_2$ and the detector 9.

The curve plotted over the aperture $B_1$ represents the phases with which the partial rays which pass through the respective points of the aperture $B_1$, reach the spot on the specimen 8 after going through the lens 7 having an aperture error. In the embodiment according to the lefthand side of FIG. 6 the closed areas $F_{11}$ of the aperture $B_1$ are just so wide that they shield off all partial rays with negative phase (shaded areas of the curve $\phi$), while all partial rays with positive phase pass through the open areas $F_{12}$. The closed areas of the complementary aperture $B_2$ are designated with $F_{21}$, the open areas with $F_{22}$.

In the embodiment according to the right-hand side of FIG. 6 the closed areas $F_{11'}$ of the aperture $B_1$ are made wider than in the embodiment shown to the left, so that they shield off not only the partial rays with negative phase but also partial rays with small positive phase. The open areas $F_{12'}$ are correspondingly narrower, so that for the same intensity of the electron source the intensity of the spot in the specimen 8 is reduced. For compensation, the open areas $F_{22'}$ of the aperture $B_2$ are, according to the right-hand side of FIG. 6, made wide like the closed areas $F_{11'}$ of the aperture $B_1$, so that more scattered radiation from the specimen 8 arrives at the detector 9 through the aperture $B_2$ and contributes to the detector signal. Thus, the embodiment according to the right-hand side of FIG. 6 permits obtaining a detector signal of the same magnitude with reduced radiation stress of the specimen 8. The imaging quality of the system, i.e., the sharpness of the spot, is not impaired by the widening of the areas $F_{11'}$ of the aperture B 1.

The invention is not limited to the examples shown. The apertures $B_1$, for instance, may also be arranged between the beam generator 1–4 and the deflection system 5,5', 6,6' within the condenser lens 7 or between the latter and the specimen 8. Upon a study of this disclosure, such and other modifications will be obvious to those skilled in the art and are applicable without departing from the essential features of my invention and within the scope of the claims annexed hereto.

I claim:

1. A scanning charged particle beam microscope comprising a charged particle beam generator for generating a beam having a radiation cone having a primary longitudinal beam axis extending between said generator and a specimen, as system adjacent said generator for deflecting said beam perpendicular to the axis in accordance with a set of raster coordinates, a charged particle beam optical condenser lens disposed about said axis for focusing the beam into a small spot in the plane of said specimen for scanning thereof, said lens being disposed between said [deflecting system] *beam generator* and said specimen, a detector arrangement for providing a signal of those portions of the beam which are scattered when the specimen is irradiated, said detector being disposed about the axis under said specimen, and an aperture combination arrangement having dimension independent of the size of the radiation cone through said condenser lens, said aperture combination comprising a first, input aperture disposed about the beam axis between said [deflecting system] *beam generator* and said [condenser lens] *specimen,* and a second output aperture between said specimen and said detector complementary to said first aperture and having a first inner portion which is radiation opaque with respect to the unscattered portions of the beam complementary to said input aperture and permeable to the scattered portions of the beam and a second outer portion having a portion totally permeable in respect to scattered charged particles, the areas of said first aperture and the complementary areas of the first portion of said second aperture being ring-shaped and concentric, the outer portion of the output aperture having a radial width at least equal to one half of the radius of the inner portion whereby the ratio between primary radiation intensity and detected scattered radiation is improved for the wide primary radiation cone required for high resolution and least possible radiation loading of the specimen.

2. In a scanning microscope according to claim 1, said first aperture being a phase-correcting zone plate having closed areas which lets only such partial beams reach the specimen locality which after passing through said condenser lens have phases of the same polarity.

3. In a scanning microscope according to claim 2, the closed areas of said first aperture having a width larger that the minimum width required for shielding off all partial beams with phases of one polarity.

4. Scanning microscope according to claim 1, comprising a further deflection system between the specimen locality and said second aperture, said further deflection system being arranged for compensating the beam deflection caused by said first deflection system.

5. In a scanning microscope according to claim 1, said deflection system comprising two partial systems following each other in the direction of the beam, of which the first deflects the beam away from the optical axis of the microscope and the second redirects the deflected beam so that the axis of the redirected beam intersects the optical axis substantially in the plane of said first aperture.

6. In a scanning microscope according to claim 5, said first aperture and said second aperture being located in coordinated optical planes of said condenser lens.

7. In a scanning microscope according to claim 5, said first aperture being located in the focal plane of said condenser lens.

8. Scanning microscope according to claim 1, comprising concentric ring-shaped radiation detectors having open areas therebetween, the open areas of said second aperture being formed by said open areas of said detectors.

9. Scanning microscope according to claim 1, comprising a velocity analyzer arranged after said second aperture.

* * * * *